US010665449B2

(12) United States Patent
Huang et al.

(10) Patent No.: US 10,665,449 B2
(45) Date of Patent: May 26, 2020

(54) INTEGRATE RINSE MODULE IN HYBRID BONDING PLATFORM

(71) Applicant: Taiwan Semiconductor Manufacturing Company, Ltd., Hsin-Chu (TW)

(72) Inventors: Xin-Hua Huang, Xihu Township (TW); Ping-Yin Liu, Yonghe (TW); Hung-Hua Lin, Taipei (TW); Hsun-Chung Kuang, Hsin-Chu (TW); Yuan-Chih Hsieh, Hsin-Chu (TW); Lan-Lin Chao, Sindian (TW); Chia-Shiung Tsai, Hsin-Chu (TW); Xiaomeng Chen, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 436 days.

(21) Appl. No.: 15/269,346

(22) Filed: Sep. 19, 2016

(65) Prior Publication Data
US 2017/0004964 A1    Jan. 5, 2017

Related U.S. Application Data

(63) Continuation of application No. 13/888,921, filed on May 7, 2013, now Pat. No. 9,446,467.
(Continued)

(51) Int. Cl.
| | |
|---|---|
| *B23K 1/00* | (2006.01) |
| *H01L 21/02* | (2006.01) |
| *B23K 1/20* | (2006.01) |
| *B23K 20/02* | (2006.01) |
| *B23K 20/233* | (2006.01) |

(Continued)

(52) U.S. Cl.
CPC ...... *H01L 21/02068* (2013.01); *B23K 1/0016* (2013.01); *B23K 1/206* (2013.01); *B23K 20/026* (2013.01); *B23K 20/233* (2013.01); *B23K 20/24* (2013.01); *H01L 24/89* (2013.01); *B23K 2101/40* (2018.08); *B23K 2101/42* (2018.08); *H01L 2224/80894* (2013.01);
(Continued)

(58) Field of Classification Search
CPC ............ H01L 2224/94; H01L 21/3065; H01L 21/6715; H01L 21/02057; H01L 21/67028; H01L 21/67742; B23K 20/00; B23K 20/02; B23K 20/22; B23K 26/342; B23K 26/354
See application file for complete search history.

(56) References Cited

U.S. PATENT DOCUMENTS

| | | |
|---|---|---|
| 5,985,739 A | 11/1999 | Plettner et al. |
| 7,385,283 B2 | 6/2008 | Wu et al. |

(Continued)

FOREIGN PATENT DOCUMENTS

| | | |
|---|---|---|
| JP | 2007538397 A | 12/2007 |
| KR | 1020050101324 A | 10/2005 |

(Continued)

*Primary Examiner* — Erin B Saad
(74) *Attorney, Agent, or Firm* — Slater Matsil, LLP

(57) ABSTRACT

A method includes performing a plasma activation on a surface of a first package component, removing oxide regions from surfaces of metal pads of the first package component, and performing a pre-bonding to bond the first package component to a second package component.

20 Claims, 10 Drawing Sheets

Related U.S. Application Data

(60) Provisional application No. 61/785,993, filed on Mar. 14, 2013.

(51) Int. Cl.
*B23K 20/24* (2006.01)
*H01L 23/00* (2006.01)
 B23K 101/40  (2006.01)
 B23K 101/42  (2006.01)

(52) U.S. Cl.
CPC ............ *H01L 2224/80895* (2013.01); *H01L 2224/80896* (2013.01); *H01L 2224/80986* (2013.01)

(56) References Cited

U.S. PATENT DOCUMENTS

| | | | |
|---|---|---|---|
| 2002/0036066 A1* | 3/2002 | Ogawa | H01J 7/3244 156/345.12 |
| 2003/0025962 A1 | 2/2003 | Nishimura | |
| 2004/0106272 A1 | 6/2004 | Kwak | |
| 2005/0014375 A1 | 1/2005 | Kim et al. | |
| 2006/0130750 A1* | 6/2006 | Ishikawa | G03B 27/32 118/300 |
| 2006/0185592 A1* | 8/2006 | Matsuura | H01L 21/31116 118/715 |
| 2007/0212884 A1* | 9/2007 | Yamamoto | G03F 7/11 438/694 |
| 2007/0232023 A1 | 10/2007 | Tong et al. | |
| 2008/0163899 A1* | 7/2008 | Takiguchi | H01L 21/67028 134/30 |
| 2009/0092162 A1 | 4/2009 | Huff et al. | |
| 2010/0025863 A1 | 2/2010 | Gruber et al. | |
| 2010/0261332 A1* | 10/2010 | Kim | H01L 21/02046 438/455 |
| 2011/0000512 A1 | 1/2011 | Toshima et al. | |
| 2013/0320556 A1 | 12/2013 | Liu et al. | |
| 2014/0263586 A1 | 9/2014 | Huang et al. | |

FOREIGN PATENT DOCUMENTS

| | | |
|---|---|---|
| TW | 200739671 | 10/2007 |
| TW | I335066 B | 1/2008 |
| TW | 201003809 A | 1/2010 |

* cited by examiner

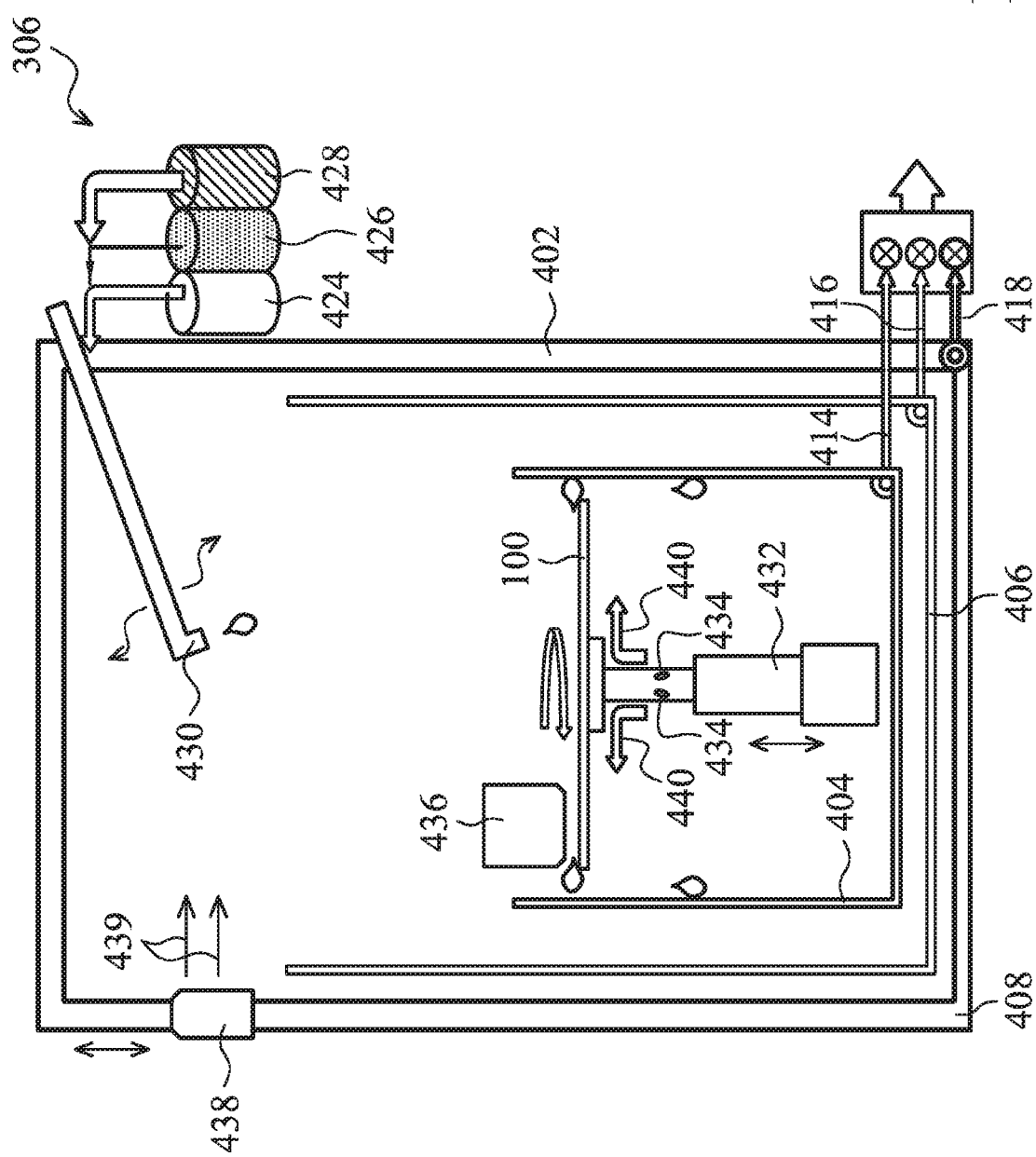

INTEGRATE RINSE MODULE IN HYBRID BONDING PLATFORM

PRIORITY CLAIM AND CROSS-REFERENCE

This application is a continuation of U.S. patent application Ser. No. 13/888,921, entitled "Integrate Rinse Module in Hybrid Bonding Platform," filed on May 7, 2013, which application claims the benefit of the following provisionally filed U.S. patent application: U.S. Patent Application No. 61/785,993, filed on Mar. 14, 2013, and entitled "Integrated Clean Station in Hybrid Bonding System," which applications are hereby incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the fusion bonding, an oxide surface of a wafer is bonded to an oxide surface or a silicon surface of another wafer. In the eutectic bonding, two eutectic materials are placed together, and are applied with a high pressure and a high temperature. The eutectic materials are hence melted. When the melted eutectic materials are solidified, the wafers are bonded together. In the direct metal-to-metal bonding, two metal pads are pressed against each other at an elevated temperature, and the inter-diffusion of the metal pads causes the bonding of the metal pads. In the hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for bonding package components and the apparatus for performing the bonding are provided in accordance with various exemplary embodiments. The intermediate stages of the bonding process are illustrated. The variations of the apparatus and bonding methods in accordance with embodiments are discussed. Throughout the various views and illustrative embodiments, like reference numbers are used to designate like elements.

FIGS. 1 through 8 illustrate cross-sectional views of intermediate stages in a bonding process in accordance with exemplary embodiments of the present disclosure. The process steps may be performed using the integrated hybrid bonding system 300, which is schematically shown in the process flow in FIG. 9. The process flow in accordance with the embodiments is briefly described herein, and the details of the process flow and integrated hybrid bonding system 300 are discussed referring to the process steps shown in FIGS. 1 through 8.

Figure 9:
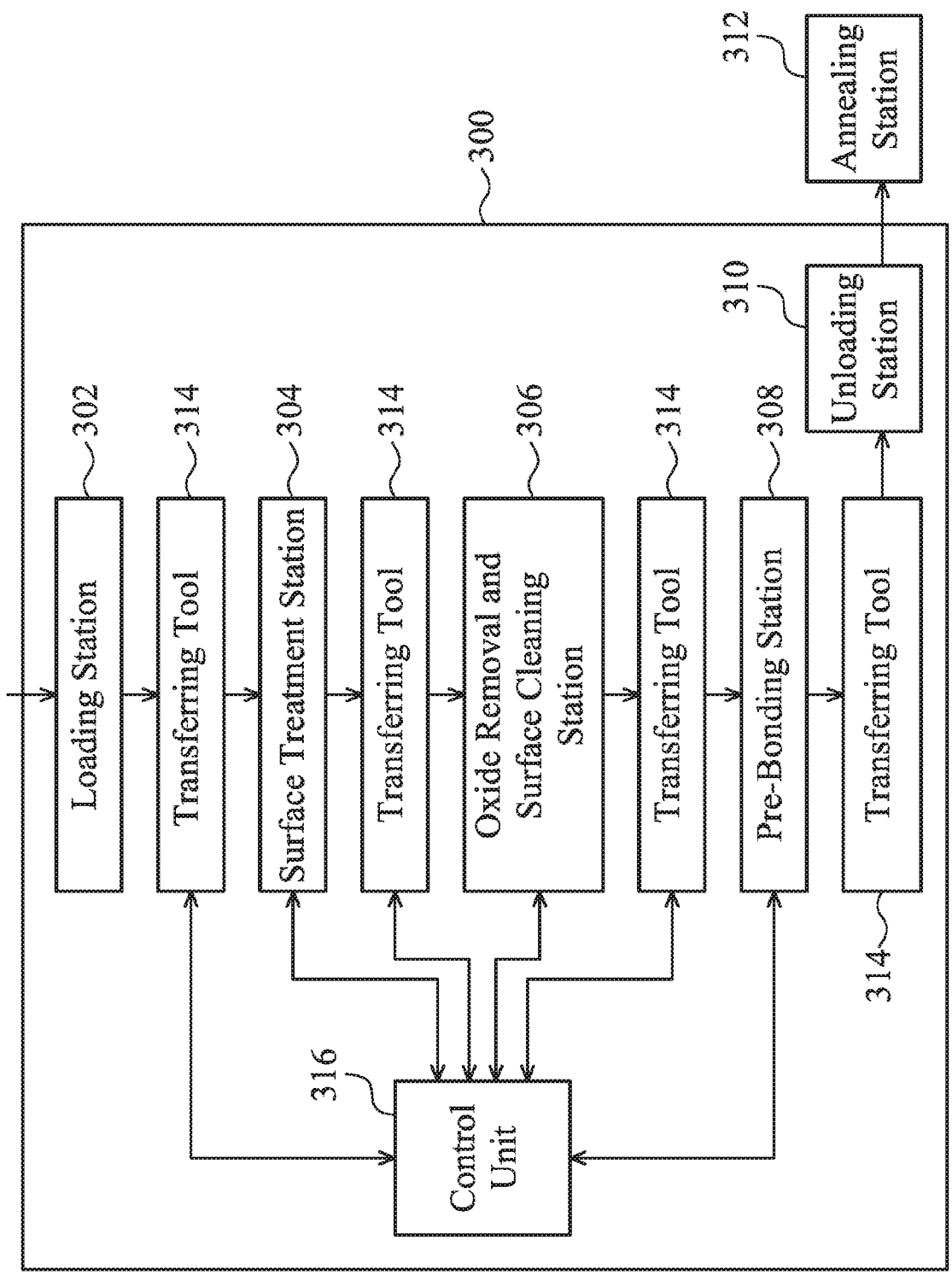
FIG. 9 illustrates a process flow for bonding package components and a hybrid bonding system for performing the bonding in accordance with exemplary embodiments.

Referring to FIG. 9, the package components that are to be bonded (for example, package components 100 and 200 in FIGS. 1 and 2, respectively) are loaded into integrated hybrid bonding system 300 through loading station 302. Integrated hybrid bonding system 300 may be located in a controlled environment, for example, filled with clean air or nitrogen. Alternatively, integrated hybrid bonding system 300 is located in open air. Next, a surface treatment/activation is performed on the surfaces of the package components, wherein the surface treatment is performed in surface treatment station 304. In the surface treatment, the exposed surfaces of the dielectric materials in the package components are activated. An integrated cleaning step is then performed on the package components to remove metal oxides, chemicals, particles, or other undesirable substances from the surfaces of the package components. Integrated cleaning station 306 is configured to perform the integrated cleaning step in accordance with some embodiments.

A pre-bonding is then performed to bond the package components together. The pre-bonding is performed in pre-bonding station 308. After the pre-bonding, the package components are bonded to each other. The bonded package components may then be unloaded from integrated hybrid bonding system 300 through unloading station 310, and transferred into annealing station 312. The bonding strength is then enhanced through a thermal annealing, which is held in thermal annealing station 312.

In the integrated hybrid bonding system 300, a plurality of transferring tools 314 are used to transfer the package components between stations 304, 306, and 308, so that stations 304, 306, and 308 may be integrated together as an integrated system. Transferring tools 314 may include robot arms (not shown), transferring guides (not shown), and/or the like, which are used to automatically transfer the package components from one station to another, so that the bonding process may be automated. After the bonding process is finished, the bonded package components are unloaded from integrated hybrid bonding system 300 using unloading station 310, which may include robot arms, for example. In addition, some or all of stations 304, 306, and 308 and transferring tools 314 may be connected to a central control unit 316, which controls, and coordinates, the operations of stations 304, 306, and 308 and transferring tools 314.

Figure 1:
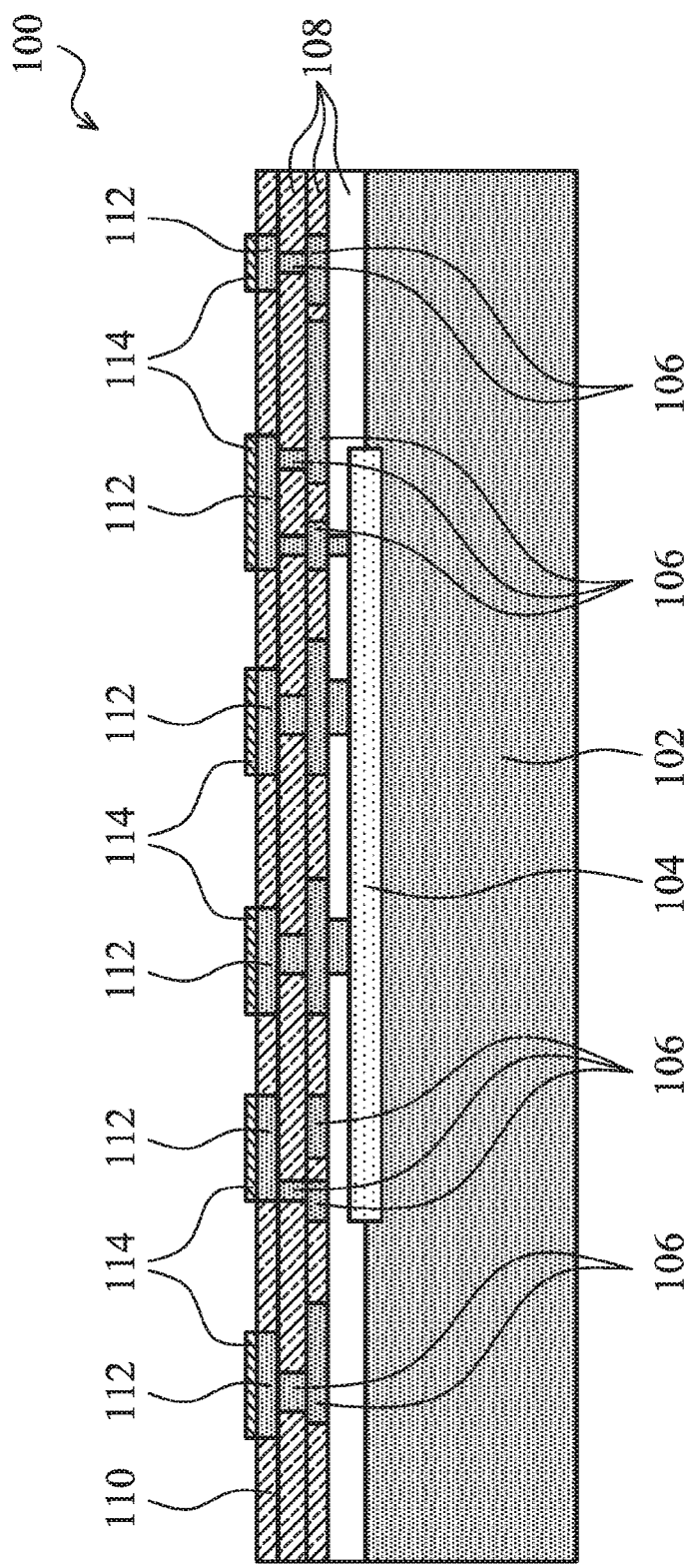
FIG. 1 illustrates a schematic cross-sectional view of a first package component that is to be bonded in accordance with some exemplary embodiments.

A brief hybrid bonding process is discussed herein referring to FIGS. 1 through 8. Referring to FIG. 1, package component 100 is illustrated. Package component 100 may comprise a device wafer, a package substrate strip, an interposer wafer, or the like. In the embodiments in which package component 100 comprise a device wafer, package component 100 may include semiconductor substrate 102, which may be, for example, a silicon substrate, although other semiconductor substrates are also usable. Active devices 104 may be formed on a surface of substrate 102, and may include, for example, transistors. Metal lines and vias 106 are formed in dielectric layers 108, which may be low-k dielectric layers in some embodiments. The low-k dielectric layers 108 may have dielectric constants (k values) lower than about 3.5, lower than about 3.0, or lower than about 2.5, for example. Dielectric layers 108 may also comprise non-low-k dielectric materials having dielectric constants (k values) greater than 3.9. Metal lines and vias 106 may comprise copper, aluminum, nickel, tungsten, or alloys thereof. Metal lines and vias 106 interconnect active devices 104, and may connect active devices 104 to the overlying metal pads 112.

In alternative embodiments, package component 100 is an interposer wafer, which is free from active devices therein. Package component 100 may, or may not, include passive devices (not shown) such as resistors, capacitors, inductors, transformers, and the like in accordance with some embodiments.

In yet alternative embodiments, package component 100 is a package substrate strip. In some embodiments, package component 100 includes laminate package substrates, wherein conductive traces 106 (which are schematically illustrated) are embedded in laminate dielectric layers 108. In alternative embodiments, package components 100 are build-up package substrates, which comprise cores (not shown) and conductive traces (represented by 106) built on opposite sides of the cores.

In each of the embodiments wherein package component 100 is a device wafer, an interposer wafer, a package substrate strip, or the like, surface dielectric layer 110 is formed at the surface of package component 100. In some embodiments, surface dielectric layer 110 is an oxide layer, which may comprise silicon oxide, SiON, SiN, or the like. Metal pads 112 are formed in surface dielectric layer 110, and may be electrically coupled to active devices 104 through metal lines and vias 106. Metal pads 112 may also be formed of copper, aluminum, nickel, tungsten, or alloys thereof. The top surface of surface dielectric layer 110 and the top surfaces of metal pads 112 are substantially level with each other. FIG. 1 also illustrates metal oxides regions 114 formed on the surfaces of metal pads 112. Metal oxide regions 114 may be the native oxide regions that are formed due to the exposure of metal pads 112 to open air.

In the embodiments wherein package component 100 is a device wafer, surface dielectric layer 110 and metal pads 112, which are used for the subsequent bonding, may be on the front side (the side with active devices 104) or the back side of substrate 102, although FIG. 1 illustrates that surface dielectric layer 110 and metal pads 112 are on the front side of substrate 102.

Figure 2:
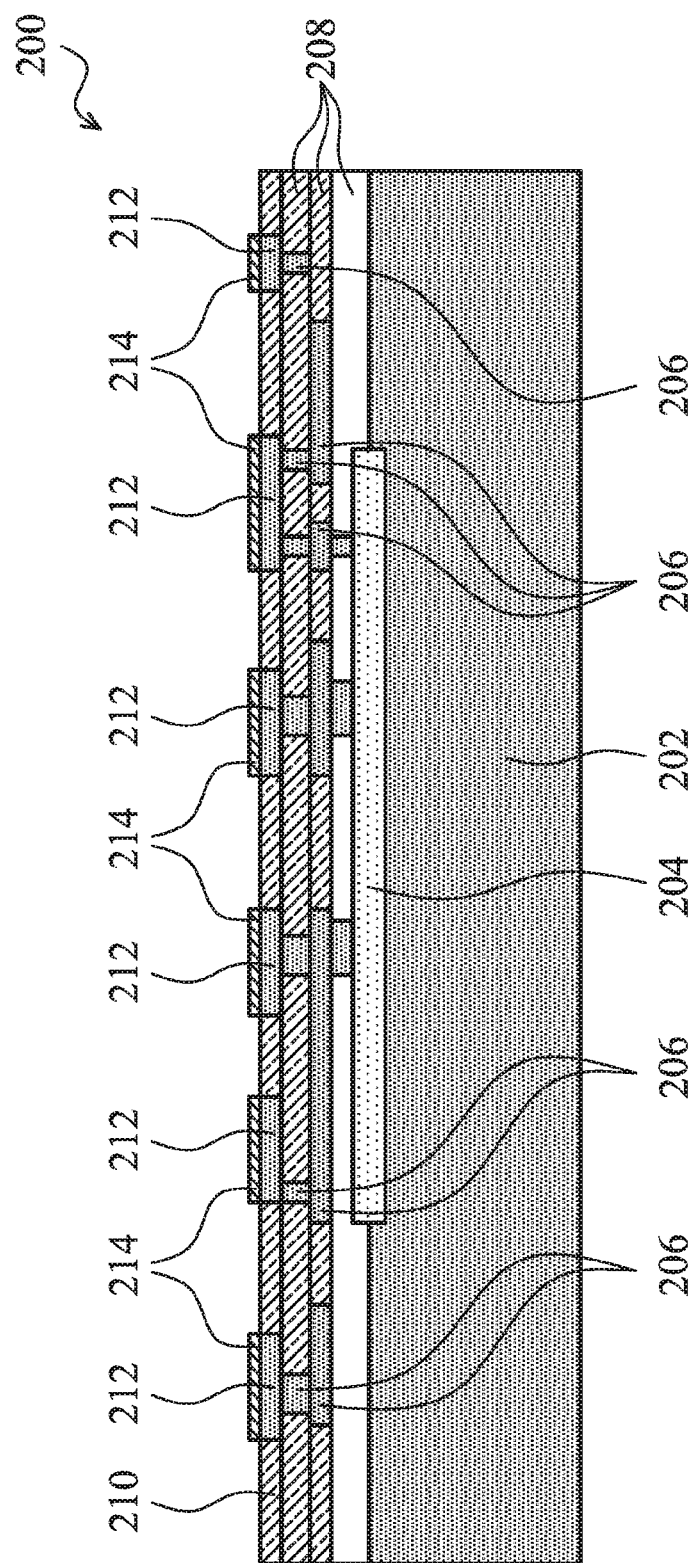
FIG. 2 illustrates a schematic cross-sectional view of a second package component that is to be bonded to the first package component.

FIG. 2 illustrates package component 200, which is to be bonded to package component 100. Package component 200 may also be selected from a device wafer, an interposer wafer, a package substrate, and the like. In the illustrated FIG. 2, package component 200 includes substrate 202, active devices 204, dielectric layers 208, metal lines and vias 206 in dielectric layers 208, surface dielectric layer 210, and metal pads 212. Package component 200 may have a structure similar to what is described for package component 100, and the details are not repeated herein. The materials of the features in package component 200 may be found referring to the like features in package component 100, with the like features in package component 100 starting with number "1," which features correspond to the features in package component 200 and having reference numerals starting with number "2."

Figure 3:
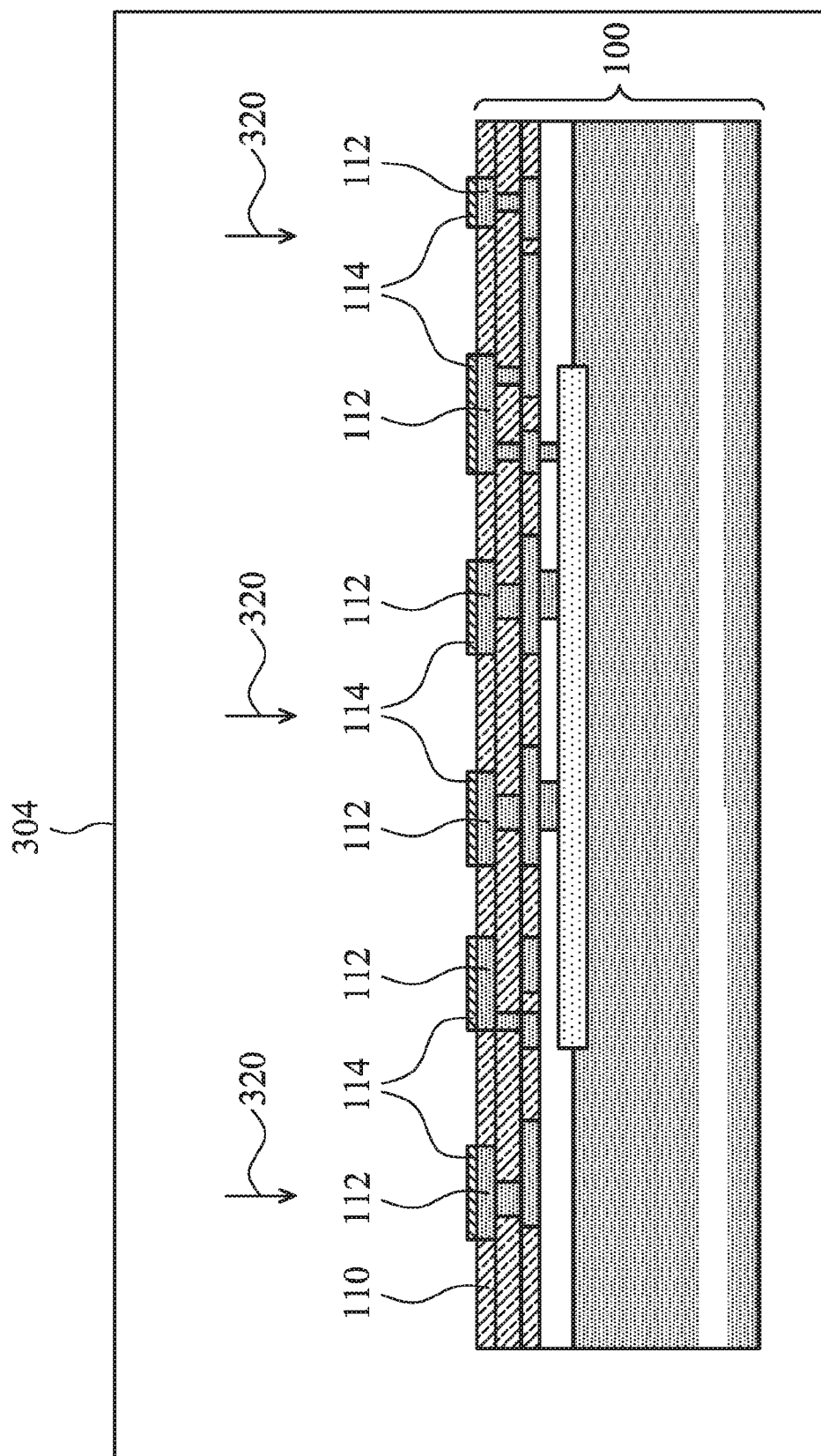
FIG. 3 illustrates a cross-sectional view of a plasma activation of the first package component.

Next, referring to FIG. 3, package component 100 is loaded into surface treatment station 304, which is a part of integrated hybrid bonding system 300 in FIG. 9. The loading may be performed using loading station 302 as described regarding FIG. 9. Referring to FIG. 3, a surface treatment (symbolized by arrows 320) is performed on the surface of package component 100. In some embodiments, the surface treatment includes a plasma treatment.

The plasma treatment may be performed in a vacuum environment (a vacuum chamber), for example, which is a part of the surface treatment station 304 (FIGS. 3 and 9). The process gas used for generating the plasma may be a hydrogen-containing gas, which includes a first combined gas of hydrogen ($H_2$) and argon (Ar), a second combined gas of $H_2$ and nitrogen ($N_2$), or a third combined gas of $H_2$ and helium (He). In some exemplary embodiments, the flow rate ratio of $H_2$ in the first, the second, or the third combined gas, whichever is used in the plasma treatment, may be between about 4 percent and about 5 percent. Through the treatment, the number of OH groups at the surface of surface dielectric layer 110 is increased, which is beneficial for forming strong fusion bonds. Furthermore, the hydrogen helps reduce the metal oxide 114 on the surfaces of metal pads 112 back to metal. The plasma treatment may also be performed using pure or substantially pure $H_2$, Ar, or $N_2$ as the process gas, which treats the surfaces of metal pads 112 and surface dielectric layer 110 through reduction and/or bombardment. The plasma used in the treatment may be low-power plasma, with the power for generating the plasma between about 10 Watts and about 2,000 Watts. Using surface treatment station 304 in FIG. 3, package component 200 is also treated, which treatment is essentially the same as the treatment of package component 100.

Figure 4:
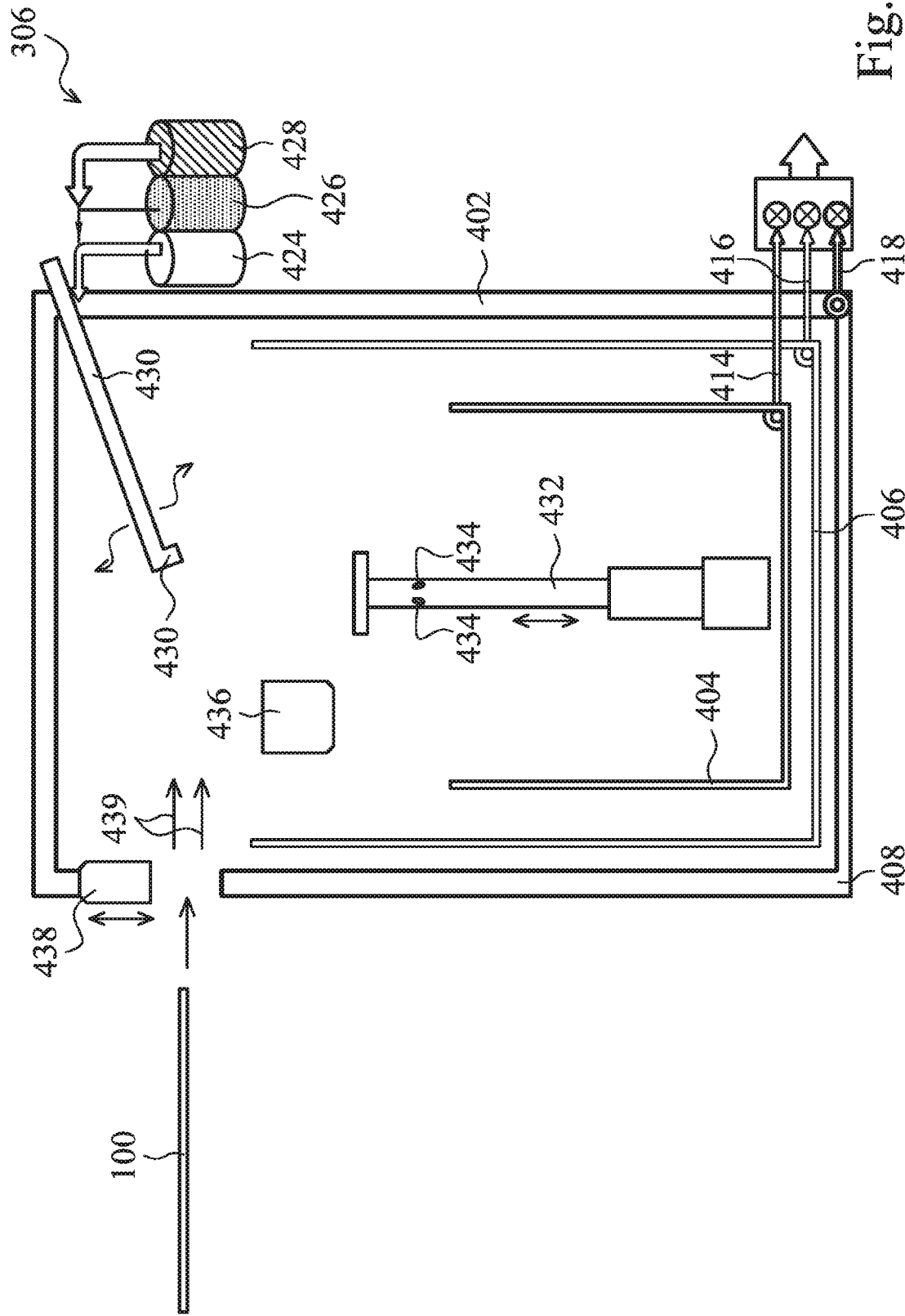
FIGS. 4 through 6 illustrate an integrated cleaning process including a metal oxide removal and a de-ionized water cleaning process, which integrated cleaning process is performed in an integrated cleaning station.

Next, referring to FIG. 4, package component 100 is transferred to integrated cleaning station 306, and a metal oxide removal and a De-Ionized (DI) water cleaning are performed on package component 100. The integrated cleaning station 306 includes chamber 402, which may be sealed to confine the chemical vapors, which chemical vapors are evaporated from the chemicals used in the cleaning processes that are performed inside chamber 402. Integrated cleaning station 306 includes a plurality of containers 404, 406, and 408 therein. In some embodiments, the plurality of containers is disposed by placing smaller containers inside lager containers. For example, container 404 is smaller than, and is placed inside, container 406, and container 406 is smaller than, and is placed inside, container 408. Furthermore, the sidewalls of the outer containers are higher than the sidewalls of the respective inner containers therein. For example, container 408 has the highest sidewalls, while container 404 has the lowest sidewalls. Containers 404, 406, and 408 are connected to outlets 414, 416, and 418, respectively, so that the chemical solutions collected by the containers may be extracted out of chamber 402, and may be collected separately in accordance with the types of the collected chemical solutions. In some exemplary embodiments, containers 404, 406, and 408 are used to collect used acid solution, used alkaline solution, and used DI water, respectively. In alternative embodiments, the functions of containers 404, 406, and 408 may be switched.

Integrated cleaning station 306 also includes a plurality of storages, for example, 424, 426, and 428. The plurality of storages is used to store the chemicals/solutions that are used in the metal oxide removal and the DI water cleaning. For example, 424, 426, and 428 may store an acidic solution, an alkaline solution, and DI water, respectively. Integrated cleaning station 306 is configured to mix the chemicals and the DI water, and dispose the chemicals, either mixed or not mixed, to nozzle 430, which is used to dispense the chemical solution to the package component (such as package component 100 in FIGS. 5A, 5B, and 6) that is to be cleaned.

Figure 5A:
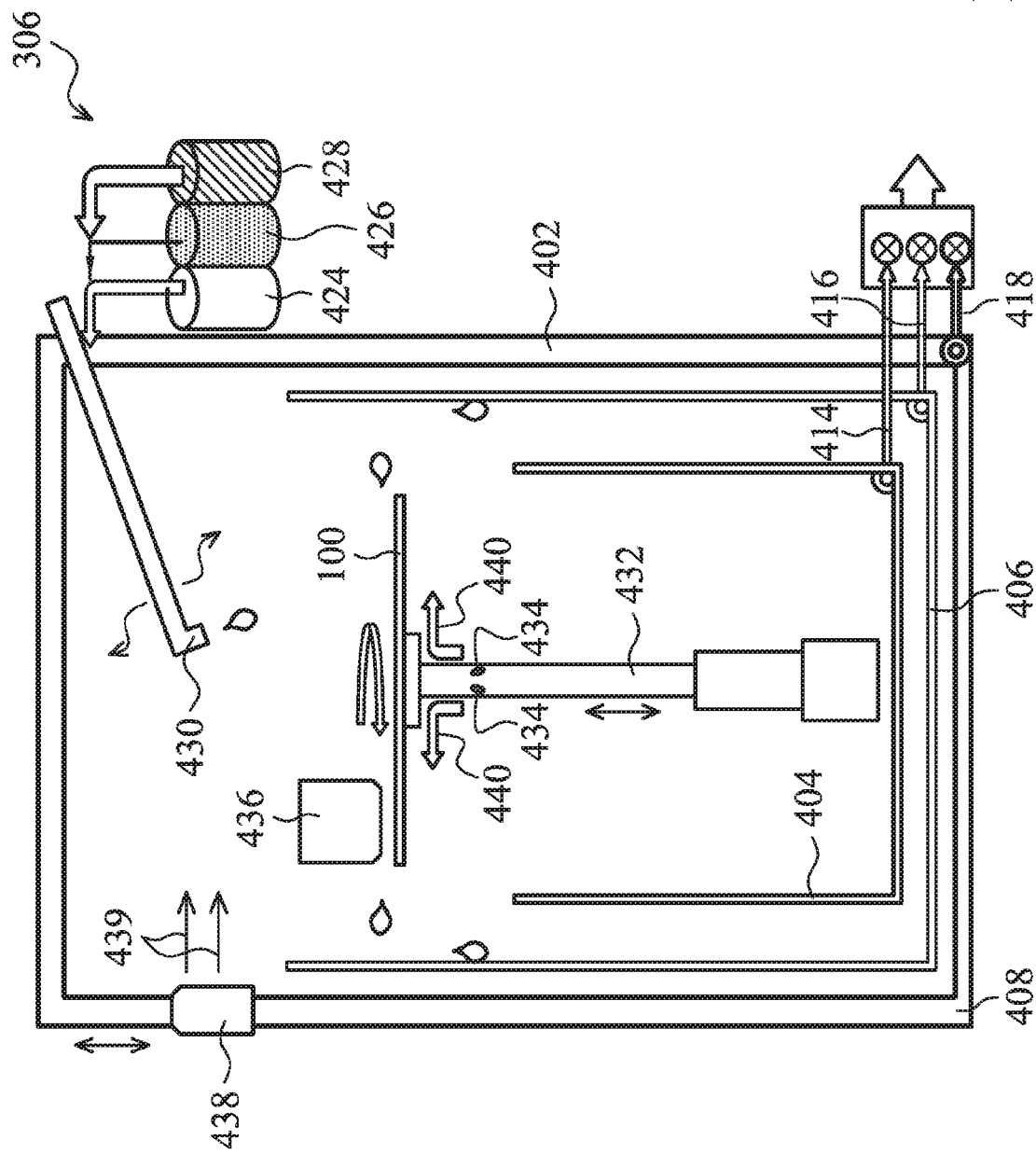
Figure 6:
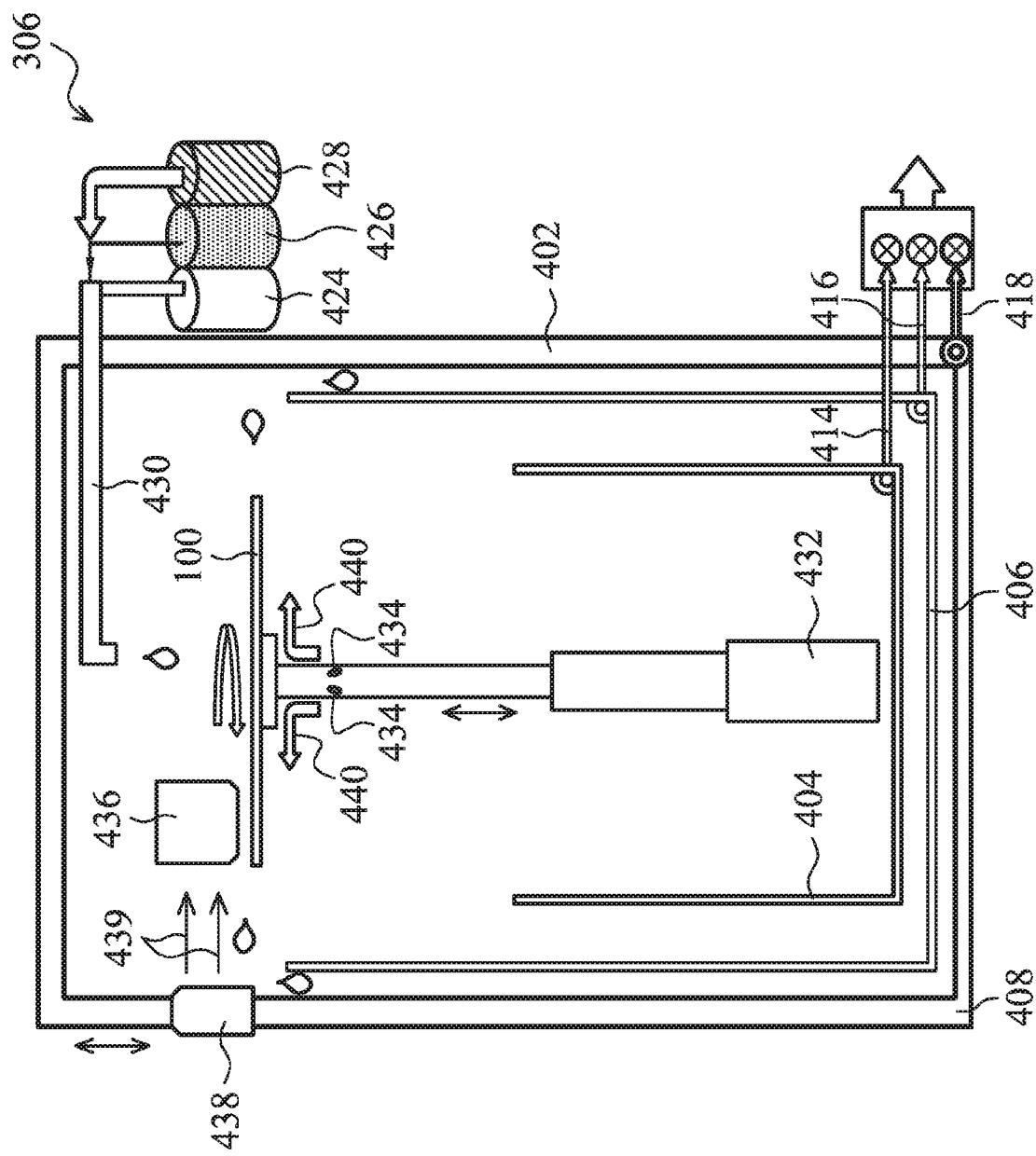

Retractable wafer support 432 is located in chamber 402. Retractable wafer support 432 may extend or retract as desired to different levels during the integrated cleaning process. Hence, retractable wafer support 432 may raise package component 100, as shown in FIG. 6, or lower package component 100, as shown in FIG. 5B. In some embodiments, air outlets 434 are disposed in retractable wafer support 432, and are used to blow air 440 to the back side of package component 100, as will be discussed referring to FIGS. 5A, 5B, and 6.

Integrated cleaning station 306 also includes ultrasonic generator 436, which is used to generate ultrasound. The ultrasound is used in the cleaning process, for example, when DI water is disposed on package component 100. As also shown in FIG. 4, chamber 402 includes door 438, which is opened to allow package component 100 to be transported into and out of chamber 402.

Referring to FIG. 5A, after package component 100 is transported into chamber 402, door 438 is closed. During the time period that door 438 is opened, as shown in FIG. 4, and during the time period door 438 is closed, as shown in FIGS. 5A, 5B, and 6, a negative pressure is generated in chamber 402, for example, by suck air 439 into chamber 402, and then evacuate the air through an outlet (not shown). With the negative pressure, which means that the pressure inside chamber 402 is lower than the pressure (for example, one atmosphere) outside chamber 402, air always flows into, not out of, chamber 402 (except through the outlet). Hence, the chemical vapors in chamber 402 will not escape to pollute the package components and other tools in integrated cleaning station 306.

FIG. 5A illustrates the metal oxide removal using an alkaline solution, through which oxide regions 114 (FIG. 1) are removed. An alkaline solution such as Ammonium Hydroxide ($NH_4OH$) solution is disposed on package component 100. During the oxide removal, package component 100 is rotated to spin off the used alkaline solution. Through the reaction of the alkaline solution with metal oxide regions 114, metal oxide regions 114 are removed. In addition, some loose particles and undesirable substances on the surfaces of metal pads 112 and surface dielectric layer 110 are also removed. Retractable wafer support 432 may adjust the height of package component 100 to a level higher than the top edges of container 404, and lower than the top edges of container 406. The alkaline solution spun off from package component 100 may thus be spun off to the sidewalls of container 406, and evacuated out of chamber 402 through outlet 416. During the metal oxide removal using the alkaline solution, ultrasonic generator 436 may, or may not, supply ultrasound to package component 100.

FIG. 5B illustrates the metal oxide removal using an acidic solution, through which oxide regions 114 (FIG. 1) may also be removed. During the oxide removal, an acidic solution such as formic acid (HCOOH) solution is disposed on package component 100. Package component 100 is rotated to spin off the used acidic solution. Through the use of the acidic solution, the metal oxide regions 114 on the surfaces of metal pads 112 are removed. Some particles and undesirable substances on the surface of metal pads 112 and surface dielectric layer 110 are also removed. Retractable wafer support 432 may lower package component 100 to a level lower than the top edges of container 404. The acidic solution spun off from package component 100 may thus be spun off to the sidewalls of container 404, and evacuated out of chamber 402 through outlet 414. During the metal oxide removal using the acidic solution, ultrasonic generator 436 may, or may not, supply ultrasound to package component 100.

In accordance with some embodiments, one or both of the alkaline cleaning and/or acid cleaning is performed on package component 100 before it is pre-bonded. After the alkaline cleaning and/or the acid cleaning, a DI water cleaning is performed, as shown in FIG. 6, during which DI water is dispensed on the respective package component 100. Package component 100 is also rotated to spin off the used DI water. Through the use of DI water, the residue of the acidic solution and/or the alkaline solution is removed. During the DI water clean, retractable wafer support 432 may raise package component 100 to a level higher than the top edges of container 406, and lower than the top edges of container 408. The DI water spun off from package component 100 may thus be spun off to the sidewalls of container 408, and evacuated out of chamber 402 through outlet 418. During the cleaning using DI water, ultrasonic generator 436 may, or may not, supply ultrasound to package component 100.

During the alkaline cleaning, the acid cleaning, and possibly the DI water cleaning, air, clean air, nitrogen, or other type of gas, which are represented by arrows 440, may be blown out of outlets 434 (FIGS. 5A, 5B, and 6). This prevents the acidic solution and the alkaline solution from flowing to the backside of package component 100 to contaminate the backside.

Figure 7:
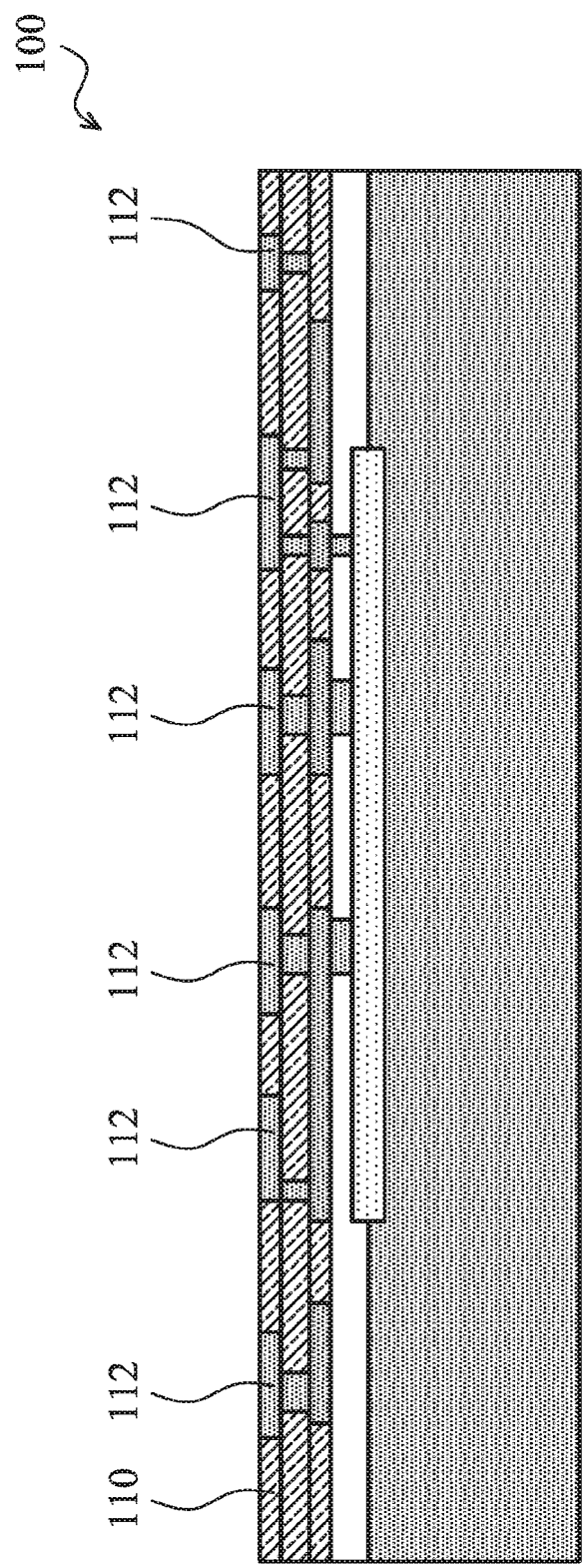
FIG. 7 illustrates a schematic cross-sectional view of the first package component after the integrated cleaning process is performed.

Package component 200 is also cleaned using essentially the same process as shown in FIGS. 4 through 6. After the integrated cleaning, the oxide regions on both package components 100 and 200 are removed. FIG. 7 illustrates package component 100, wherein metal pads 112 no longer have metal oxide regions thereon.

Figure 8:
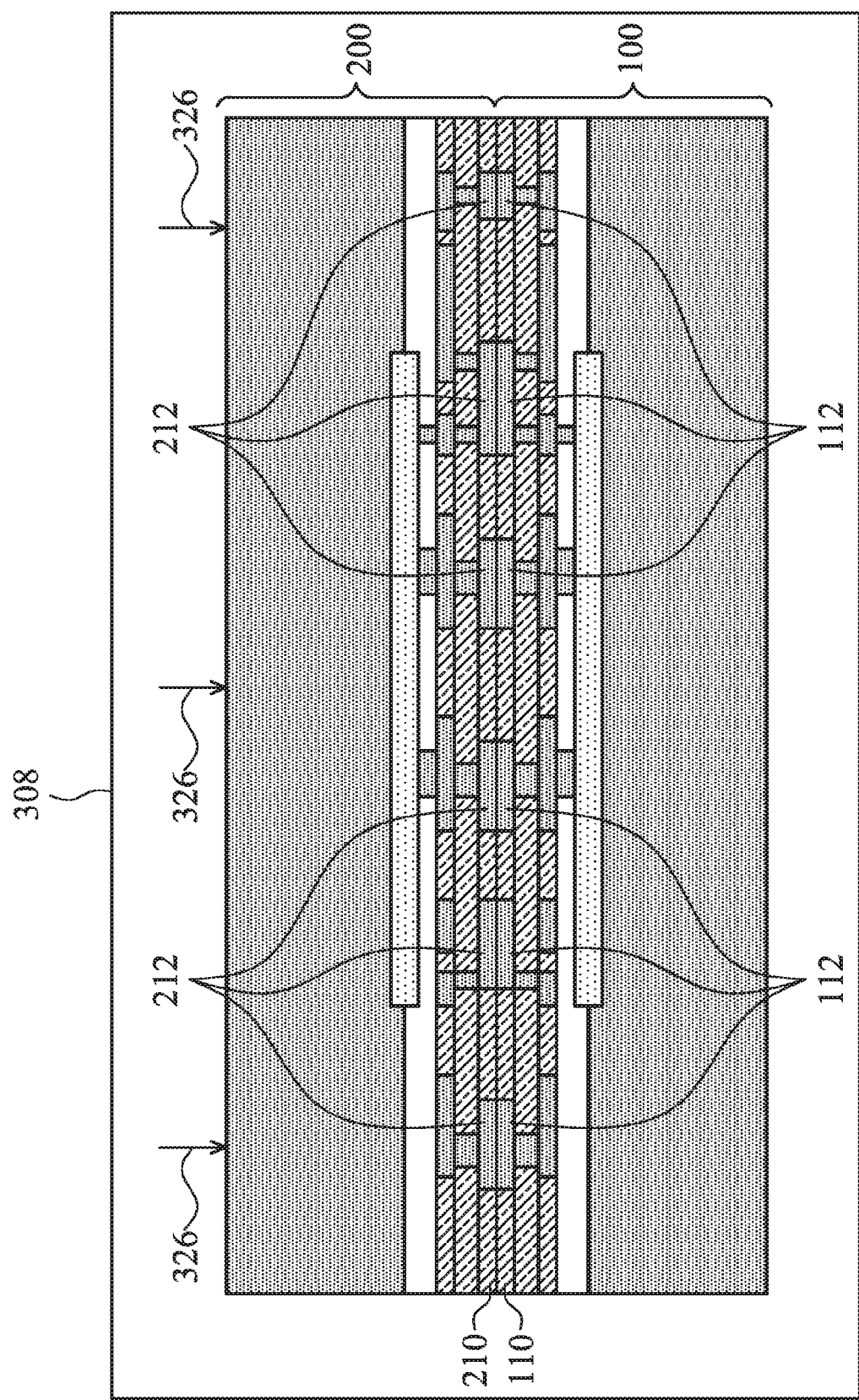
FIG. 8 illustrates the cross-sectional view of a pre-bonding process for pre-bonding the first and the second package components.

Next, as shown in FIG. 8, package components 100 and 200 are transferred into pre-bonding station 308 (also refer to FIG. 9). Package components 100 and 200 are aligned, with bond pads 112 of package component 100 being aligned to bond pads 212 of package component 200. The alignment may be performed in pre-bonding station 308 (which is an alignment and pre-bonding station in these embodiments), although it may also be performed in a separate alignment station. After the alignment, package components 100 and 200 are pressed against each other. At the time the pre-bonding is performed, substantially no oxide is re-grown on the surface of metal pads 112 and 212. This is due to the fact that the oxide regions are removed in the integrated cleaning station 306, which is a part of the hybrid bonding system. Accordingly, the time period between the removal of the oxide and the pre-bonding is short enough, and hence substantially no oxide is grown. In addition, the environment of hybrid bonding system 300 (FIG. 9) may be controlled, which includes, for example, using cleaned air or nitrogen (or other inert gases) to fill hybrid bonding system 300, removing moisture from the air in hybrid bonding system 300, etc. As shown in FIG. 8, during the pre-bonding, pressing force 326 is applied to press package components 100 and 200 against each other. Pressing force 326 may be lower than about 5 Newton per die in some exemplary embodiments, although a greater or a smaller force may also be used. The pre-bonding may be performed at the room temperature (for example, between about 21° C. and about 25° C.), although higher temperatures may be used. The bonding time may be shorter than about 1 minute, for example.

After the pre-bonding, surface dielectric layer 110 and 210 are bonded to each other. The bonding strength, however, needs to be improved in a subsequent annealing step. The bonded package components 100 and 200 in combination are referred to as bonded pair 324 hereinafter. Bonded pair 324 is unloaded out of pre-bonding station 308 and integrated cleaning station 306 (FIG. 9), and is transferred to annealing station 312 (FIG. 9) for annealing.

Referring to FIG. 9, in annealing station 312, the bonded pair 324 is annealed at a temperature between about 300° C. and about 400° C., for example. The annealing may be performed for a period of time between about 1 hour and 2 hours in some exemplary embodiments. When temperature rises, the OH bonds in oxide layers 110 and 210 (FIG. 8) break to form strong Si—O—Si bonds, and hence package components 100 and 200 are bonded to each other through fusion bonds. In addition, during the annealing, the copper in metal pads 112 and 212 diffuse to each other, so that metal-to-metal bonds are also formed. Hence, the resulting bonds between package components 100 and 200 are hybrid bonds.

In the embodiments of the present disclosure, by integrating the integrated cleaning station into the hybrid bonding system, the oxides on the surfaces of metal bonds are removed. Experiments have shown that in conventional bonding processes in which the DI water clean is performed, and no oxide removal is performed in the respective hybrid bonding station 300, a resulting bond structure has a clearly visible interface, indicating the inferior inter-diffusion of copper atoms. The bond quality is hence low. As a comparison, by removing the oxide in hybrid bonding system, there is substantially no metal oxide re-grown when the bonding is performed. The resulting bond structure has no visible interface, indicating the high-quality inter-diffusion of copper atoms has occurred, and quality of bonds is improved.

In accordance with some embodiments, a method includes performing a plasma activation on a surface of a first package component, removing oxide regions from surfaces of metal pads of the first package component, and performing a pre-bonding to bond the first package component to a second package component.

In accordance with other embodiments, a hybrid bonding system includes a plasma treatment chamber configured to perform a plasma cleaning on a package component, and an integrated cleaning station. The integrated cleaning station includes a chamber, and a plurality of storages outside of the chamber. The plurality of storages comprises a first storage storing one of an acidic solution and an alkaline solution therein and a second storage storing deionized water therein. The integrated cleaning station further includes a nozzle in the chamber and connected to the plurality of storages, and a retractable wafer support configured to hold the package component thereon. The hybrid bonding system further includes an alignment and pre-bonding station configure to align and bonding the package component with an additional package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
using an apparatus to form a package component, the apparatus comprising:
an integrated cleaning station comprising:
a plasma treatment chamber;
a chamber;
a storage outside of the chamber, wherein the storage is configured to store liquid;
a nozzle in the chamber and connected to the storage; and
a retractable wafer support in the chamber, wherein the retractable wafer support is configured to move the package component vertically to different levels, and spin the package component at the different levels;
wherein the method comprises:
cleaning the package component in the chamber using a first chemical;
transporting the package component into the plasma treatment chamber; and
Performing a plasma treatment on the package component in the plasma treatment chamber.

2. The method of claim 1, wherein the integrated cleaning station further comprises a first container in the chamber, and the method further comprises:
adjusting the retractable wafer support to a first level, wherein at the first level, the package component is inside the first container, and is lower than first top edges of the first container, wherein when the first chemical is disposed on the package component, the package component is simultaneously spun at the first level; and
draining the first chemical collected by the first container.

3. The method of claim 2, wherein the apparatus further comprises a second container, with the first container located in the second container, and the method further comprises:
adjusting the retractable wafer support to spin the package component at a second level higher than the first top edges of the first container and lower than second top edges of the second container;
disposing a second chemical on the package component and simultaneously spinning the package component at the second level; and
draining the second chemical collected by the second container.

4. The method of claim 3 further comprising:
adjusting the retractable wafer support to spin the package component at a third level higher than the second top edges of the second container; and
disposing a liquid on the package component and simultaneously spinning the package component at the third level.

5. The method of claim 1, wherein the apparatus further comprises an alignment and pre-bonding station, and the method further comprises:
transporting the package component into the alignment and pre-bonding station; and
aligning the package component with an additional package component using the alignment and pre-bonding station.

6. The method of claim 5, wherein the method further comprises pre-bonding the package component to the additional package component using the alignment and pre-bonding station.

7. The method of claim 1, wherein the retractable wafer support further comprises an air outlet, and the method further comprises blowing air to a back surface of the package component through the air outlet.

8. A method comprising:
placing a package component into an apparatus, the apparatus comprising:
an integrated cleaning station comprising:
a chamber;
a first container in the chamber;
a second container, with the first container located in the second container;
a storage outside of the chamber, wherein the storage is configured to store liquid;
a nozzle in the chamber and connected to the storage; and
a retractable wafer support in the chamber, wherein the retractable wafer support is configured to rotate the package component, and spin the package component at different levels, wherein the method comprises cleaning the package component in the chamber using a first chemical;
adjusting the retractable wafer support to a first level, wherein at the first level, the package component is inside the first container, and is lower than first top edges of the first container, wherein when the first chemical is disposed on the package component, the package component is simultaneously spun at the first level;
draining the first chemical collected by the first container;
adjusting the retractable wafer support to spin the package component at a second level higher than the first top edges of the first container and lower than second top edges of the second container;
disposing a second chemical on the package component and simultaneously spinning the package component at the second level; and
draining the second chemical collected by the second container.

9. The method of claim 8 further comprising:
adjusting the retractable wafer support to spin the package component at a third level higher than the second top edges of the second container; and
disposing a liquid on the package component and simultaneously spinning the package component at the third level.

10. The method of claim 8, wherein the apparatus further comprises a plasma treatment chamber, and the method further comprises:
transporting the package component into the plasma treatment chamber; and
performing a plasma treatment on the package component in the plasma treatment chamber.

11. The method of claim 8 further comprising:
transporting the package component into an alignment and pre-bonding station; and
aligning the package component with an additional package component using the alignment and pre-bonding station.

12. The method of claim 11, wherein the method further comprises pre-bonding the package component to the additional package component using the alignment and pre-bonding station.

13. The method of claim 8, wherein the retractable wafer support further comprises an air outlet, and the method further comprises blowing air to a back surface of the package component through the air outlet.

14. A method comprising:
placing a package component into a chamber;
using a nozzle in the chamber to spray a chemical onto the package component;
using a retractable wafer support in the chamber to move the package component vertically to a first level;
using the retractable wafer support to spin the package component at the first level;
with the package component being at the first level, removing oxides on surface metal pads of the package component;
using the retractable wafer support to move the package component vertically to a second level different from the first level;
using the retractable wafer support to spin the package component at the second level; and
cleaning the package component using de-ionized water.

15. The method of claim 14 further comprising:
dispensing a first chemical on the package component when the package component is spun at the first level;
collecting the first chemical using a first container in the chamber;
dispensing a second chemical on the package component when the package component is spun at the second level; and
collecting the second chemical using a second container in the first container.

16. The method of claim 15, wherein the collecting the first chemical comprises spinning the first chemical into the first container, and the first chemical passes top edges of the second container and drops into the first container.

17. The method of claim 15, wherein the second container is fully inside the first container, and the second container has top edges lower than top edges of the first container.

18. The method of claim 15 further comprising:
cleaning the package component using de-ionized water; and
collecting the de-ionized water using a third container in the chamber.

19. The method of claim 7, wherein the retractable wafer support further comprises an additional air outlet, and the method further comprises blowing air to the back surface of the package component through the additional air outlet.

20. The method of claim 1 further comprising supplying ultrasound when the package component is moved vertically to at least two of the different levels.

* * * * *